United States Patent
Sauer et al.

(10) Patent No.: US 11,552,283 B2
(45) Date of Patent: Jan. 10, 2023

(54) METHOD OF COATING A FLEXIBLE SUBSTRATE IN A R2R DEPOSITION SYSTEM, AND VAPOR DEPOSITION SYSTEM

(71) Applicant: Applied Materials, Inc., Santa Clara, CA (US)

(72) Inventors: Andreas Sauer, Großostheim (DE); Thomas Deppisch, Aschaffenburg (DE); Mathew Dean Allison, Frankfurt (DE)

(73) Assignee: Applied Materials, Inc., Santa Clara, CA (US)

( * ) Notice: Subject to any disclaimer, the term of this patent is extended or adjusted under 35 U.S.C. 154(b) by 43 days.

(21) Appl. No.: 16/985,063

(22) Filed: Aug. 4, 2020

(65) Prior Publication Data

US 2022/0045312 A1 Feb. 10, 2022

(51) Int. Cl.
*H01M 4/04* (2006.01)
*C23C 16/54* (2006.01)
(Continued)

(52) U.S. Cl.
CPC ......... *H01M 4/0435* (2013.01); *C23C 16/545* (2013.01); *B05D 1/32* (2013.01);
(Continued)

(58) Field of Classification Search
CPC .... H01M 4/0421; C23C 16/54; C23C 16/545; C23C 16/56; C23C 14/04; C23C 14/24;
(Continued)

(56) References Cited

U.S. PATENT DOCUMENTS

| 10,243,228 B2* | 3/2019 | Cho | H01M 8/1004 |
| 2005/0072361 A1* | 4/2005 | Yang | C23C 14/246 |
| | | | 427/248.1 |

(Continued)

FOREIGN PATENT DOCUMENTS

| EP | 1460643 A1 | 9/2004 |
| WO | 2014118063 A1 | 8/2014 |

(Continued)

OTHER PUBLICATIONS

International Search Report/ Written Opinion issued to PCT/US2021/043889 dated Nov. 24, 2021.

*Primary Examiner* — Brian K Talbot

(74) *Attorney, Agent, or Firm* — Patterson + Sheridan, LLP

(57) ABSTRACT

A method of coating a flexible substrate in a roll-to-roll deposition system is described. The method includes unwinding the flexible substrate from an unwinding roll, the flexible substrate having a first coating on a first main side thereof; measuring a lateral positioning of the first coating while guiding the flexible substrate to a coating drum; adjusting a lateral position of the flexible substrate on the coating drum depending on the measured lateral positioning of the first coating; and depositing a second coating on the flexible substrate, particularly on a second main side of the (Continued)

flexible substrate opposite the first main side. Further described is a vacuum deposition apparatus for conducting the methods described herein.

11 Claims, 4 Drawing Sheets

(51) Int. Cl.

| | |
|---|---|
| C23C 16/56 | (2006.01) |
| B05D 1/00 | (2006.01) |
| B05D 1/32 | (2006.01) |
| C23C 14/04 | (2006.01) |
| C23C 14/24 | (2006.01) |
| C23C 14/56 | (2006.01) |
| C23C 14/54 | (2006.01) |

(52) U.S. Cl.
CPC ............. *B05D 1/60* (2013.01); *C23C 14/04* (2013.01); *C23C 14/24* (2013.01); *C23C 14/54* (2013.01); *C23C 14/56* (2013.01); *C23C 16/54* (2013.01); *C23C 16/56* (2013.01)

(58) Field of Classification Search
CPC ........... C23C 14/54; C23C 14/56; B05D 1/32; B05D 1/60
USPC .... 427/8, 96.8, 96.9, 98.4, 177, 251, 255.28
See application file for complete search history.

(56) References Cited

U.S. PATENT DOCUMENTS

| | | | |
|---|---|---|---|
| 2010/0051181 A1* | 3/2010 | Mori ................... | H01M 4/8896 |
| | | | 156/390 |
| 2012/0160165 A1 | 6/2012 | Nishizawa et al. | |
| 2015/0007769 A1* | 1/2015 | Miura ...................... | B05C 9/04 |
| | | | 118/708 |
| 2017/0259552 A1* | 9/2017 | Kang ...................... | B32B 39/00 |
| 2018/0337410 A1* | 11/2018 | Lee ...................... | H01M 4/8896 |
| 2019/0088987 A1* | 3/2019 | Herle ................... | H01M 4/667 |

FOREIGN PATENT DOCUMENTS

| | | | | |
|---|---|---|---|---|
| WO | 2017042614 A1 | 3/2017 | | |
| WO | WO-2018218214 A1 * | 11/2018 | ........... | B29C 43/222 |

* cited by examiner

METHOD OF COATING A FLEXIBLE SUBSTRATE IN A R2R DEPOSITION SYSTEM, AND VAPOR DEPOSITION SYSTEM

TECHNICAL FIELD

Embodiments of the present disclosure relate to substrate coating by thermal evaporation in a roll-to-roll deposition system. Embodiments of the present disclosure particularly relate to the deposition of one or more coating strips on both sides of a flexible substrate via evaporation, e.g. on a flexible metal foil, for example, for the manufacture of a lithium battery. Specifically, embodiments relate to methods of two-side coating of a flexible substrate, methods of manufacturing an anode of a lithium battery, as well as roll-to-roll vapor deposition apparatuses.

BACKGROUND

Various techniques for deposition on a flexible substrate, for example, chemical vapor deposition (CVD) and physical vapor deposition (PVD) are known. For coating a substrate at high deposition rates, thermal evaporation may be used as a PVD process. For thermal evaporation, a coating material is heated up to produce a vapor that may be deposited, for example, on a substrate that is supported by a coating drum, i.e. a rotatable drum with a curved drum surface for supporting a web substrate. Increasing the temperature of the heated coating material increases the vapor concentration and can facilitate high deposition rates.

For example, the coating material to be deposited on the substrate can be heated in a crucible to produce vapor at an elevated vapor pressure. The vapor can stream from the crucible to a heated vapor distributor with a plurality of nozzles. The vapor can be directed by the plurality of nozzles onto a surface of the moving web substrate that is supported on the coating drum to deposit a coating strip on the flexible substrate.

For the manufacture of batteries, several coatings may be deposited on a flexible substrate, and typically both sides of the flexible substrate may be coated. There are different approaches for depositing coatings on both substrate sides in a roll-to-roll deposition system. In a first approach, both sides of the substrate may be subsequently coated along one single path through a deposition system that is configured for two-side coatings. Alternatively, the flexible substrate may first be wound through a deposition system for coating the first main side of the substrate with a first coating, and the substrate may subsequently be wound again through the same deposition system or through another deposition system in an opposite orientation for coating the second main side of the substrate with a second coating.

In the latter case, it may be challenging to deposit the second coating exactly on a predetermined lateral position on the substrate with respect to the first coating. For example, the lateral positioning of the first coating may slightly vary along the length direction of the substrate, or the first coating may be deposited on the flexible substrate with an unknown positional accuracy.

Accordingly, it would be beneficial to provide methods for accurately depositing a second coating on a flexible substrate in a roll-to-roll deposition system, particularly on a second substrate side opposite a first substrate side that is already coated with a first coating. Further, it would be beneficial to provide a vapor deposition apparatus configured to accurately deposit a second coating on a flexible substrate in a roll-to-roll deposition system, particularly for the manufacture of an anode of a lithium battery.

SUMMARY

In light of the above, a method of coating of a flexible substrate in a roll-to-roll deposition system, a vapor deposition apparatus, and a method of manufacturing an anode of a lithium battery according to the independent claims are provided. Further aspects, advantages and features of the present disclosure are apparent from the description and the accompanying drawings.

According to one aspect, a method of coating of a flexible substrate in a roll-to-roll deposition system is provided. The method includes: unwinding the flexible substrate from an unwinding roll, the flexible substrate having a first coating on a first main side; measuring a lateral positioning of the first coating while guiding the flexible substrate to a coating drum; adjusting a lateral position of the flexible substrate on the coating drum depending on the measured lateral positioning of the first coating; and depositing a second coating on the flexible substrate.

In some embodiments, the second coating is deposited on a second main side of the substrate opposite the first main side to provide a flexible substrate with coatings on both sides.

According to one aspect, a vapor deposition apparatus for coating a flexible substrate is provided. The vapor deposition apparatus includes an unwinding roll for unwinding a flexible substrate; at least one vapor source configured to deposit an evaporated material on the flexible substrate; a coating drum arranged downstream of the unwinding roll and configured for guiding the flexible substrate past the at least one vapor source; a sensor configured to measure a lateral positioning of a first coating on a first main side of the flexible substrate; an actuator configured to adjust a lateral position of the flexible substrate on the coating drum; and a controller configured to control the actuator depending on the measured lateral positioning of the first coating.

According to one aspect, a method of manufacturing an anode of a lithium battery is provided. The method includes guiding a flexible substrate in a vapor deposition apparatus, particularly in a vapor deposition apparatus according to any of the embodiments described herein. The method further includes adjusting a lateral position of the flexible substrate depending on a measured lateral positioning of a first coating provided on a first main side of the flexible substrate; and directing an evaporated material to a second main side of the flexible substrate past an edge exclusion shield to form a second coating on the flexible substrate such that the second coating is laterally aligned with the first coating. The evaporated material may include a lithium containing material or lithium.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the present disclosure are also directed at methods for manufacturing the described apparatuses and products, and methods of operating the described apparatuses. Described embodiments include method aspects for carrying out every function of the described apparatuses.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Reference will now be made in detail to the various embodiments of the disclosure, one or more examples of which are illustrated in the figures. Within the following description of the drawings, the same reference numbers refer to same components. Only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

Within the following description of the drawings, the same reference numbers refer to the same or similar components. Generally, only the differences with respect to the individual embodiments are described. Unless specified otherwise, the description of a part or aspect in one embodiment applies to a corresponding part or aspect in another embodiment as well.

According to embodiments of the present disclosure, apparatuses and methods for coating by evaporation in a vacuum chamber are provided. For depositing a flexible substrate (also referred to herein as a "web" or "foil") with a coating material by evaporation, the coating material may be heated inside a vapor source, e.g. inside a crucible of the vapor source, above the evaporation temperature of the coating material. The evaporated material may then be guided by a distributor toward a plurality of nozzles for directing the evaporated material toward the flexible substrate.

The vapor deposition apparatuses described herein are roll-to-roll (R2R) deposition systems configured for coating web substrates. Roll-to-roll deposition systems are understood in that a web substrate of a considerable length, such as hundreds of meters or more, is uncoiled from a storage spool, coated with one or more thin layers while being supported on one or more coating drums, and optionally recoiled again on a wind-up spool. In the manufacture of thin film batteries as well as in the display industry and the photovoltaic industry, the demand for roll-to-roll deposition systems is increasing. For example, lithium batteries, touch panel elements, flexible displays, and flexible PV modules result in an increasing demand for depositing layers in R2R-coaters.

Figure 1:
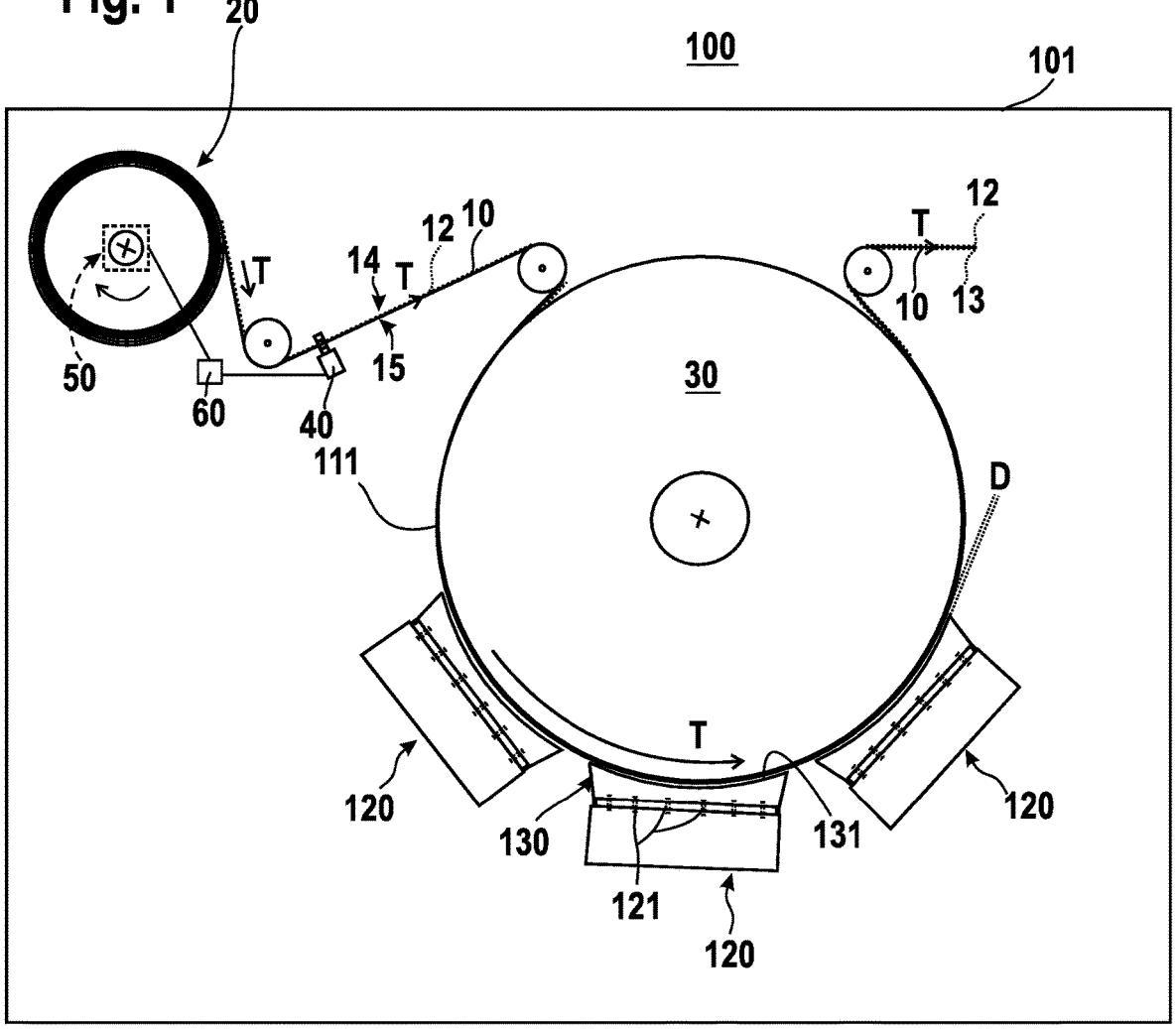
FIG. 1 shows a schematic sectional view of a vapor deposition apparatus configured to conduct the methods described herein.
Figure 2:
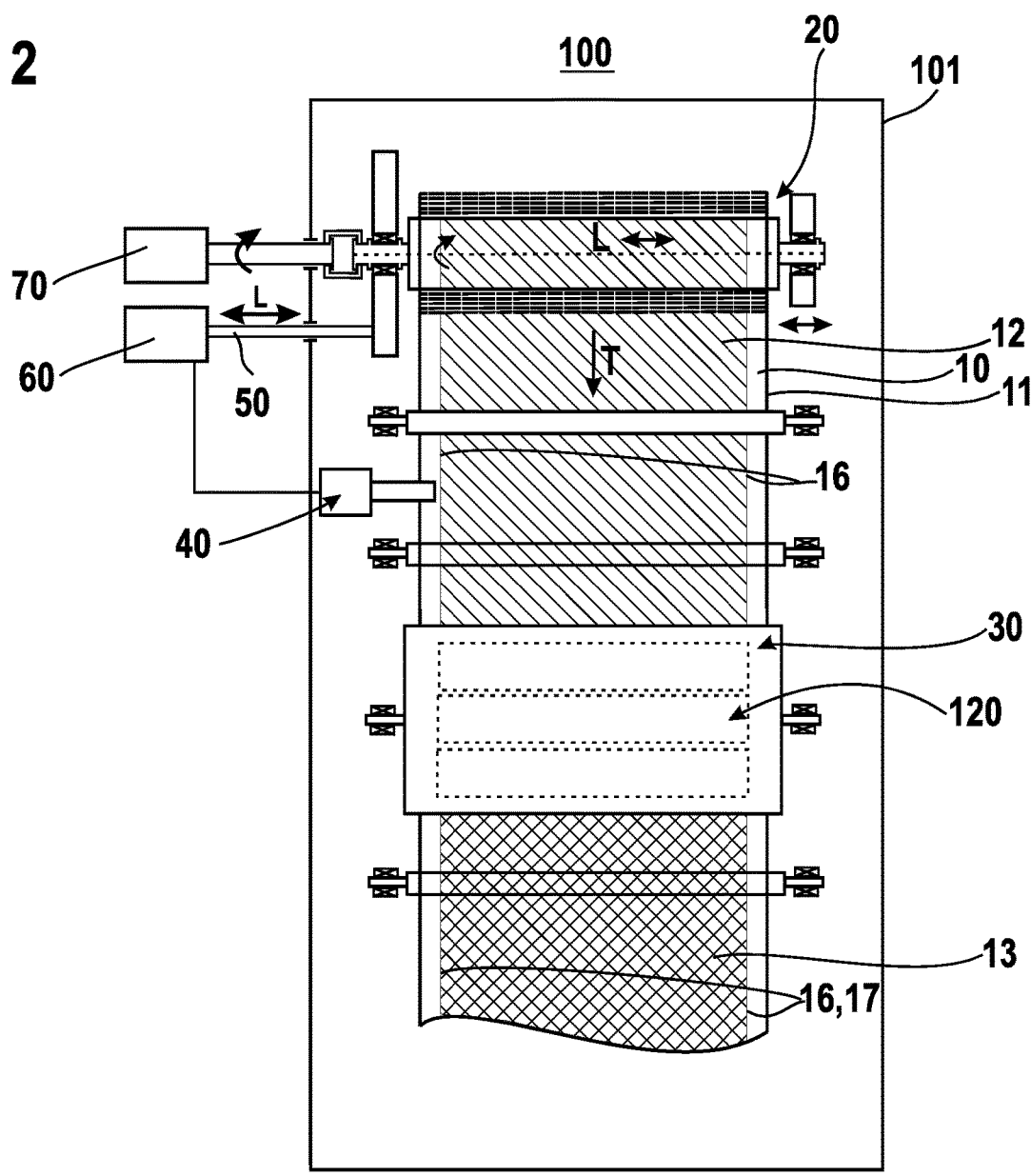
FIG. 2 shows a schematic top view of the vapor deposition apparatus of FIG. 1.

FIG. 1 is a schematic sectional view of a vapor deposition apparatus 100 of a R2R-deposition system according to embodiments described herein. FIG. 2 is a schematic top view of the vapor deposition apparatus 100 of FIG. 1. The vapor deposition apparatus 100 may be configured to conduct any of the methods described herein.

The vapor deposition apparatus 100 may include a vacuum chamber 101 accommodating a plurality of rolls or rollers for guiding the flexible substrate 10 along a web transport path T from an unwinding roll 20 to a coating drum 30. After the coating of the flexible substrate on the coating drum 30, the flexible substrate may be wound on a wind-up spool or may be guided toward another coating drum (not shown in the figures).

The vapor deposition apparatus 100 includes the unwinding roll 20 for unwinding the flexible substrate 10 from a storage spool and the coating drum 30 that is arranged downstream of the unwinding roll 20 along the web transport path T. The vapor deposition apparatus further includes at least one vapor source 120 configured to deposit an evaporated material on the flexible substrate. The at least one vapor source 120 faces toward the coating drum 30, and the coating drum 30 is configured to guide the flexible substrate past the at least one vapor source 120. The vapor deposition apparatus is configured to move the flexible substrate on a curved drum surface 111 of the coating drum 30 past the at least one vapor source 120 or past a plurality of vapor sources, such that the flexible substrate can be coated with the evaporated material while being guided on and supported by the coating drum.

According to embodiments described herein, the vapor deposition apparatus is configured to coat a flexible substrate having already a first coating 12 provided on a first main side of the substrate. The first coating 12 may be an area coating extending continuously in the length direction of the flexible substrate in the form of one or more coating strips. Specifically, the first coating 12 may have side edges 16 (see FIG. 2) that may essentially extend in the length direction of the flexible substrate at respective distances from the substrate edges 11, as is schematically depicted in the top view of FIG. 2.

Methods and apparatuses described herein allow an accurate deposition of a second coating 13 on the flexible substrate having already the first coating 12 provided thereon. Specifically, the first coating 12 may be provided on a first main side 14 of the flexible substrate 10, and the second coating 13 may be deposited on a second main side 15 of the flexible substrate 10 opposite the first main side 14. Alternatively, the second coating may be deposited on top of the first coating, i.e. on the first main side 14 of the flexible substrate as well. In the manufacture of thin film batteries, the second coating 13 is typically deposited on the second main side 15 of the flexible substrate opposite the first main side 14 in lateral alignment with the first coating 12.

The second coating 13 should beneficially have a predetermined spatial relationship with the first coating 12. For example, the second coating 13 should be aligned with the first coating 12 in the lateral direction L of the web substrate (perpendicular to the length direction of the web substrate), and/or lateral edge positions of the second coating 13 should correspond to lateral edge positions of the first coating 12. Specifically, in the manufacture of thin film batteries, edges of the coated area on both substrate sides of the web should be aligned. Accurately aligning several coatings on a flexible substrate, particularly coatings on opposite substrate sides, is challenging.

Typical 2R2 deposition systems may use so called "edge control systems" that measure the position of one or both substrate edges of the flexible substrate and adjust a lateral position of the flexible substrate depending on the measured position of the substrate edge(s). If a deviation of the position of the substrate edge from a target position is detected in such control systems, the lateral position of the substrate is corrected accordingly. However, adjusting the position of the flexible substrate based on a measured position of a substrate edge may not provide a desired deposition accuracy if the second coating is to be aligned with a first coating that is already provided on the flexible substrate. For example, the lateral positioning of the first coating 12 on the flexible substrate relative to the substrate edge may slightly vary depending on (potentially unknown) parameters chosen during the deposition of the first coating, or the deposition accuracy of the first coating on the substrate may be generally unknown. Further, controlling the substrate position based on lines or other markings on the substrate may not always be possible, for example if the flexible substrate having the first coating already provided thereon does not have or may not have such markings.

According to embodiments described herein, the vapor deposition apparatus includes a sensor 40 configured to measure a lateral positioning of the first coating 12 that is already provided on the first main side 14 of the flexible substrate. The vapor deposition apparatus further includes an actuator 50 configured to adjust the lateral position of the flexible substrate on the coating drum, and a controller 60 configured to control the actuator 50 depending on the measured lateral positioning of the first coating 12. Accordingly, the lateral position of the substrate is not adjusted based on a measured lateral position of a substrate edge 11, but rather based on the lateral positioning of the first coating 12 that is already provided on the flexible substrate. If the sensor measures a deviation of the positioning of the first coating from a target positioning, the controller may control the actuator to adjust the substrate position accordingly, shifting the substrate on the coating drum to be arranged as desired relative to a coating window provided by the at least one vapor source.

A "lateral position" as used herein relates to a position in a direction perpendicular to the length direction of the flexible substrate, i.e. a position in the lateral direction L. The lateral positioning of the first coating 12 relates to the positioning of the first coating in the lateral direction L that corresponds to the axial direction of the web transport rollers.

According to some embodiments, which can be combined with other embodiments described herein, the sensor 40 is configured to measure the lateral positioning of the first coating 12 on the first main side of the substrate and to forward the measured position value as an input parameter to the controller 60 that controls the actuator 50 accordingly. The at least one vapor source 120 may be configured to deposit the second coating 13 on the second main side of the substrate opposite the first main side. Accordingly, the first and second coatings may be deposited on opposite sides of the substrate. Since the position of the flexible substrate on the coating drum 30 is adjusted depending on the measured lateral positioning of the first coating, the lateral positioning of the second coating can be accurately set relative to the positioning of the first coating as appropriate.

Specifically, the lateral position of the flexible substrate on the coating drum can be adjusted by the actuator 50 that is controlled by the controller 60 such that the second coating on the second main side is deposited in alignment with the first coating on the first main side. For example, side edges 17 of the second coating 13 may be aligned with side edges 16 of the first coating 12 with a high accuracy (see FIG. 2). Particularly, deviations in the positions of the side edges of the first and second coatings may be 0.5 mm or less, particularly 0.1 mm or less. In other words, the first and second coatings may be exactly aligned with each other, i.e. the lateral extension and lateral position of the second coating may exactly correspond to the lateral extension and position of the first coating, which may be beneficial in the manufacture of thin film batteries.

The first coating and the second coating may respectively include one or more continuous material strips extending in the length direction of the substrate. If the first coating includes two or more material strips, the second coating may include the same number of material strips aligned with the material strips of the first coating, i.e. having corresponding widths and positions in the lateral direction L.

Figure 3A:
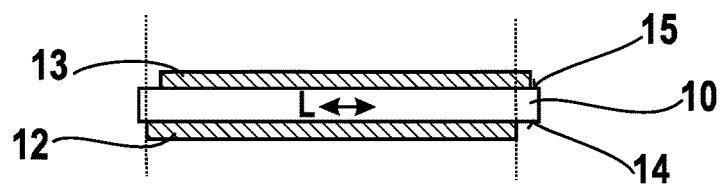
FIGS. 3a and 3b show sectional views of flexible substrates coated on both sides thereof via a conventional coating method (FIG. 3a) and via the coating method described herein (FIG. 3b)
Figure 3B:
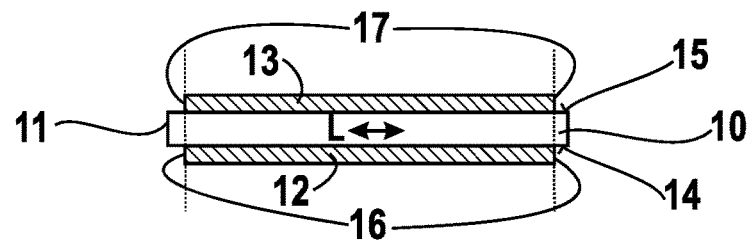

FIG. 3A shows a sectional view of a flexible substrate 10 having a first coating 12 on the first main side 14 of the flexible substrate and a second coating 13 on the second main side 15 of the flexible substrate. The first coating 12 and the second coating 13 are misaligned, i.e. the lateral positions of the coating edges of the first and second coating do not correspond to each other. FIG. 3B shows a sectional view of a flexible substrate 10 coated according to methods described herein. As is clearly visible in FIG. 3B, the second coating 13 is aligned with the first coating 12, i.e. positions of the side edges 17 of the second coating 13 correspond to positions of the side edges 16 of the first coating 12, and the width of the second coating 13 in the lateral direction L corresponds to the width of the first coating 12 in the lateral direction L.

Returning to FIGS. 1 and 2, in some embodiments, which can be combined with other embodiments described herein, the actuator 50 may include a mechanism for axially moving the unwinding roll 20. The actuator 50 may be configured for moving the unwinding roll 20 together with the flexible substrate wound on a storage spool held on the unwinding roll 20 in the lateral direction L based on an input received from the controller 60. Accordingly, the axial position of the unwinding roll 20 can be directly controlled for adjusting the lateral position of the flexible substrate on the coating drum, such that the area of the substrate that is coated by the at least one vapor source 120 can be adjusted. An axial movement of the unwinding roll 20 causes a corresponding axial movement of the substrate on the coating drum that is arranged downstream of the unwinding roll along the web transport path T.

In some embodiments, which can be combined with other embodiments described herein, the at least one vapor source 120 includes a plurality of nozzles 121 for directing the evaporated material onto the second main side 15 of the flexible substrate while the flexible substrate is supported on the coating drum 30.

The vapor deposition apparatus 100 depicted in FIG. 1 and FIG. 2 allows the coating of a flexible substrate having a first coating 12 on the first main side 14 thereof with a second coating 13. The second coating may be deposited on the second main side 15 of the flexible substrate opposite the first main side 14. The coating method described herein includes the following: The flexible substrate 10 having the first coating on the first main side is unwound from the unwinding roll 20. A lateral positioning of the first coating is measured while the flexible substrate is guided to the coating drum 30. The lateral positioning of the first coating may be measured continuously or at short time intervals, e.g.

more then ten times per second. Further, the lateral position of the flexible substrate on the coating drum 30 may be adjusted depending on the measured lateral positioning of the first coating, e.g. continuously or at short time intervals. In particular, the lateral position of the flexible substrate may be adjusted using a feedback loop, particularly a closed loop, with the measured lateral positioning of the first coating as an input parameter. The second coating 13 is deposited on an area of the flexible substrate that is supported on the coating drum, such that the coating area on which the second coating is deposited is adjusted as appropriate, e.g. for obtaining an alignment between the first and the second coatings.

In some embodiments, the second coating 13 is deposited on the second main side of the flexible substrate opposite the first main side. Accordingly, coatings on opposite sides of the flexible substrate can be deposited in good alignment with each other according to the methods described herein.

The lateral position of the flexible substrate on the coating drum may be adjusted by axially moving the unwinding roll 20 depending on the measured lateral positioning of the first coating 12. For example, the unwinding roll 20 may be axially shifted with the actuator 50, e.g. an electromechanical actuator, configured to move the unwinding roll in an axial direction. For example, the actuator 50 may include a DC motor that may be designed for linear positioning motions. The actuator may have a position feedback, i.e. a recording of a current position of the actuator.

Further, a roller drive 70 may be provided for driving the rotational movement of the unwinding roll 20. The roller drive 70 may include an electric motor configured to rotate the unwinding roll 20. Accordingly, the flexible substrate 10 can be wound from the unwinding roll 20 and guided toward the coating drum 30 along the web transport path T, optionally over one, two or more further guiding rollers that may be passive rollers.

As is schematically depicted in FIG. 2, the controller 60 may be provided at or integrated with the actuator 50. In some embodiments, the actuator 50 may be at least partially arranged outside the vacuum chamber 101 and may be configured for moving the unwinding roll 20 that is arranged inside the vacuum chamber 101. For example, a motor of the actuator 50 may be arranged outside the vacuum chamber, and a linearly movable arm of the actuator 50 may extend through a wall of the vacuum chamber to the unwinding roll 20 for axially moving the unwinding roll 20.

In some embodiments, both the actuator 50 and the roller drive 70 may be at least partially arranged outside the vacuum chamber 101. The actuator 50 may be configured such that an axial movement of the unwinding roll 20 is possible during and independent of a rotational movement of the unwinding roll 20 that is driven by the roller drive 70, as is schematically depicted in FIG. 2.

It is to be noted that the unwinding roll 20 does not necessarily include the storage spool that has the flexible substrate wound thereon, but may be understood as a spool mount for fixing the storage spool with the substrate wound thereon, the spool mount being rotatable such that the substrate can be unwound from the storage spool when the storage spool is mounted on the unwinding roll.

In some embodiments, the measuring of the lateral positioning of the first coating 12 may include determining a position of one or more side edges 16 of the first coating 12, e.g. with the sensor 40. For example, the sensor 40 may be or include an optical sensor, a contrast measurement sensor, or a distance sensor configured to determine a position of the side edge 16 of the first coating 12. For example, in some embodiments, the sensor 40 may be a camera configured to detect side edges of the coating. A camera may be beneficial to see offsets since a camera can monitor both sides at the same time. The sensor 40 may be configured and mounted such that the sensor 40 can scan the position of one or more side edges 16 of the first coating 12. For example, the side edge 16 of the first coating 12 may be spaced apart from the substrate edge 11 in the lateral direction L, and the sensor 40 may be mounted to scan the position of the side edge 16 of the first coating 12.

In some implementations, the lateral position of the flexible substrate may be adjusted such that the second coating 13 is deposited on the second main side of the flexible substrate in alignment with the first coating 12 on the first main side of the flexible substrate. Specifically, the lateral position of the flexible substrate may be adjusted such that side edges 17 of the second coating 13 are aligned with side edges 16 of the first coating 12, specifically with a deviation of 0.5 mm or less, particularly 0.1 mm or less.

In some embodiments, the second coating may be deposited as follows: evaporated material may be directed toward the second main side 15 of the flexible substrate supported on the coating drum 30 with a plurality of nozzles 121 of the at least one vapor source 120 while the flexible substrate is moved past the at least one vapor source 120 on the curved drum surface 111 of the coating drum 30.

The evaporated material may be directed toward the flexible substrate through a coating window that is defined by an edge exclusion shield 130 that masks lateral edge areas of the flexible substrate not to be coated. The actuator 50 may adjust the position of the substrate in the lateral direction L on the coating drum such that the first coating 12 is exactly arranged at the coating window that is defined by the edge exclusion shield. Accordingly, the second coating that is deposited by the at least one vapor source 120 is deposited in alignment with the first coating.

In some embodiments, which can be combined with other embodiments described herein, at least one of the first coating 12 and the second coating 13 is a metal coating, particularly a lithium coating, or may include a lithium-containing material.

The flexible substrate may include or be a metal foil, particularly a copper foil. In some embodiments, the flexible substrate may have a thickness of 50 µm or less, particularly 20 µm or less, or even 6 µm or less. For example, a metal foil or a flexible metal-coated foil may be coated in the vapor deposition apparatus described herein. In some implementations, the flexible substrate is a thin copper foil or a thin aluminum foil having a thickness below 30 µm, e.g. 6 µm or less. The flexible substrate is already coated with the first coating. The first coating may be a coating including graphite, silicon and/or silicon oxide, or a mixture thereof, e.g. in a thickness of 150 µm or less, particularly 100 µm or less, or even down to 50 µm or less. Alternatively or additionally, the first coating may be or include a lithium coating. Specifically, the first coating may include one or more of the group consisting of lithium, graphite, silicon and silicon oxide. The second coating may pre-lithiate a first coating including graphite and silicon and/or silicon oxide, or the second coating may be a lithium coating to be deposited on a second main side of the substrate opposite the first main side where the first coating is provided.

At least one of the first coating 12 and the second coating 13 may constitute an anode or form a part of an anode for the manufacture of a lithium battery. The deposition of a metal on a flexible substrate by evaporation may be used for the manufacture of batteries, such as Li-batteries. For example, a lithium layer may be deposited on a thin flexible substrate for producing the anode of a Li-battery. After assembly of the anode layer stack and the cathode layer stack, optionally with an electrolyte and/or separator therebetween, the manufactured layer arrangement may be rolled or otherwise stacked to produce the Li-battery.

Figure 4:
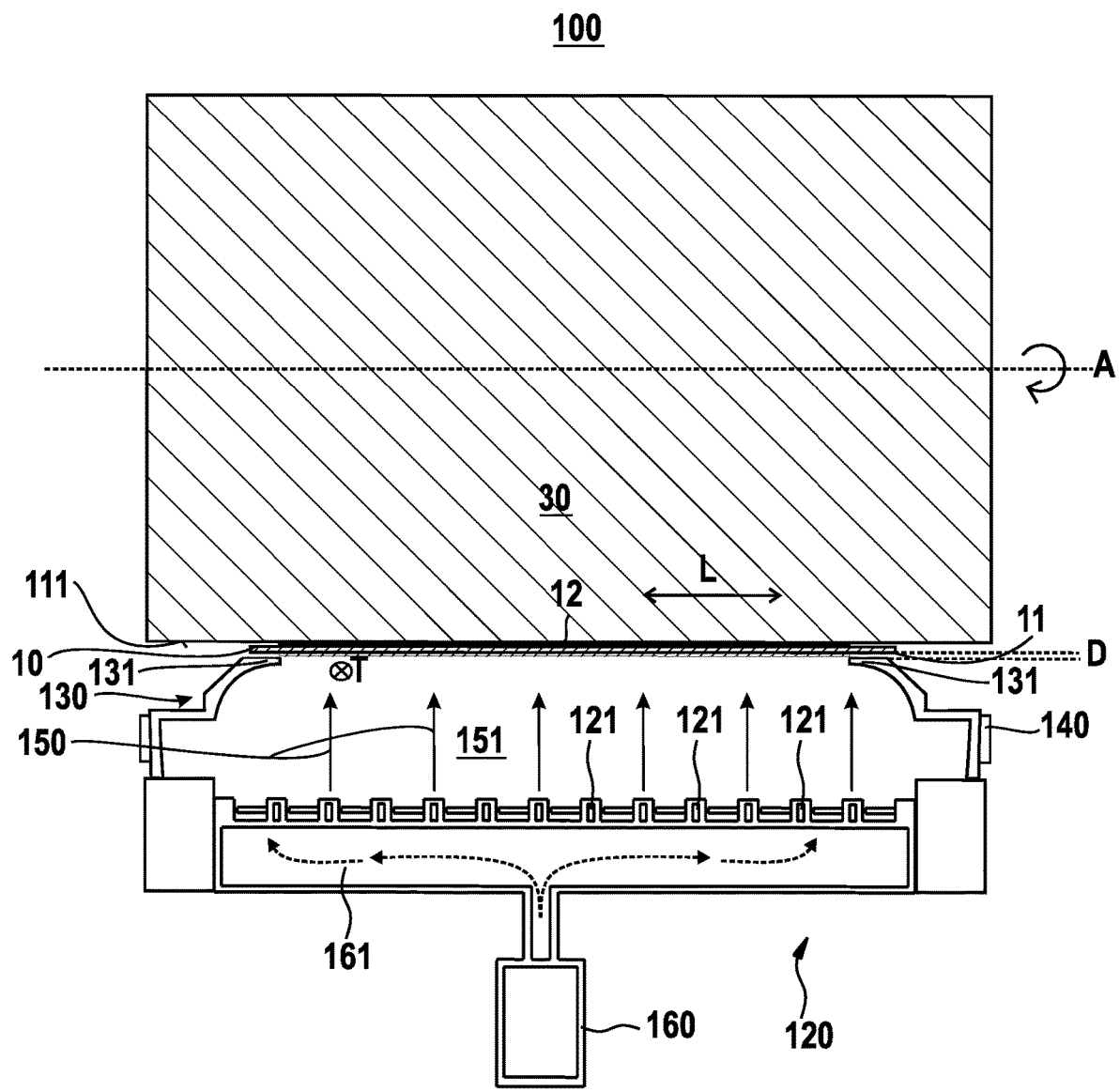
FIG. 4 shows a sectional view of a coating drum of a vapor deposition apparatus according to embodiments described herein.

FIG. 4 is a schematic sectional view of a coating drum of a vapor deposition apparatus 100 according to embodiments described herein.

The coating drum 30 includes a curved drum surface 111 configured for supporting the flexible substrate 10 that is to be coated. The at least one vapor source 120 has a plurality of nozzles 121 for directing vapor 150 toward the curved drum surface 111 through a vapor propagation volume 151. The vapor propagation volume 151 may be understood as a volume or space between the at least one vapor source 120 and the coating drum 30 through which the vapor 150 is directed by the plurality of nozzles 121. It is beneficial if most of the vapor that is emitted by the plurality of nozzles 121 is confined in the vapor propagation volume 151, i.e. in a defined volume downstream of the plurality of nozzles 121, such that a stray coating of components outside the vapor propagation volume 151, e.g. of vacuum chamber walls, can be reduced or avoided.

The coating drum 30 is rotatable around an axis A, such that the flexible substrate 10 can be moved past the at least one vapor source during vapor deposition. An accurate masking of edge areas of the flexible substrate 10 that are to be kept free of coating material (also referred to herein as "edge exclusion") is challenging when the substrate moves past the vapor source during the vapor deposition. An accurate masking of the edge areas of the flexible substrate is particularly challenging if the flexible substrate moves and is supported on a curved drum surface 111 during the vapor deposition, because the distance between the vapor source and the coating drum where the substrate is supported may vary in the circumferential direction due to the curvature of the curved drum surface 111. In some embodiments, the coating drum 30 may have a diameter in a range of 300 mm to 1400 mm or larger.

Embodiments described herein enable a reliable and accurate edge exclusion and material shielding in roll-to-roll deposition systems configured to coat a web substrate on a curved drum surface with a second coating.

According to some embodiments, the vapor deposition apparatus includes an edge exclusion shield 130 extending from the at least one vapor source 120 toward the coating drum 30 and at least partially surrounding the vapor propagation volume 151. The edge exclusion shield 130 may include an edge exclusion portion 131 for masking one or more edge areas of the flexible substrate not to be coated. In some implementations, the edge exclusion shield 130 extends along the coating drum 30 in a circumferential direction of the coating drum and follows a curvature of the curved drum surface (see FIG. 1).

The edge exclusion shield 130 may be mounted on the at least one vapor source 120, e.g. at a periphery of the vapor source or at another stationary support in the vacuum chamber, and may extend from the at least one vapor source 120 toward the coating drum 30.

The edge exclusion shield 130 may be shaped such that the edge exclusion shield at least partially or entirely surrounds the vapor propagation volume 151, reducing or preventing a propagation of the vapor 150 outside the vapor propagation volume. In other words, the edge exclusion shield 130 may form a side wall of the vapor propagation volume 151 and may confine the vapor 150 or at least a major part thereof in the vapor propagation volume. A stray coating on surfaces outside the vapor propagation volume 151 that is (at least partially or entirely) surrounded by the edge exclusion shield can be reduced, and the cleaning of the apparatus can be facilitated.

The edge exclusion shield 130 may be arranged at least at two opposite lateral sides of the vapor propagation volume 151, as is schematically depicted in the sectional view of FIG. 4, preventing vapor from exiting the vapor propagation volume 151 toward the left and right sides in FIG. 4, i.e. in the lateral direction L.

The edge exclusion shield 130 does not contact the coating drum 30, such that the flexible substrate supported on the coating drum can move past the at least one vapor source 120 and past the edge exclusion shield 130 during vapor deposition. The edge exclusion shield 130 may only leave a small gap between the edge exclusion shield 130 and the coating drum 30, e.g. a gap of 5 mm or less, 3 mm or less, 2 mm or less, or even about 1 mm or less, such that hardly any vapor can propagate past the edge exclusion shield in the lateral direction L.

The edge exclusion shield 130 may be heatable, such that vapor condensation on the edge exclusion shield 130 can be reduced or prevented when the edge exclusion shield 130 is heated to an operation temperature, e.g. an operation temperature of 500° C. or more in some embodiments. Preventing vapor condensation on the edge exclusion shield 130 is beneficial because cleaning efforts can be reduced. Further, a coating on the edge exclusion shield 130 may change the dimensions of a coating window that is provided by the edge exclusion shield. In particular, if a gap in the range of only few millimeters, e.g. of about 1 mm or less, is provided between the edge exclusion shield 130 and the coating drum 30, a coating on the edge exclusion shield would lead to a change in the gap dimensions and hence to an undesired change in an edge shape of the second coating that is deposited on the flexible substrate. Further, the utilization of the coating material can be improved when no coating material accumulates on the edge exclusion shield. Specifically, essentially all of the coating material propagating inside the vapor propagation volume can be used for coating the substrate surface if the edge exclusion shield is heated to the operation temperature that may be above a vapor condensation temperature. Specifically vapor hitting the edge exclusion shield that is provided at the operation temperature of, e.g. between 500° C. and 600° C., may be immediately re-evaporated or reflected, such that the respective vapor molecules end up on the substrate surface rather than on the surface of the edge exclusion shield.

The edge exclusion shield 130 may also be referred to herein as a "temperature-controlled shield" if the temperature of the edge exclusion shield can be set to a predetermined operation temperature during the vapor deposition. A controller and a respective heating arrangement 140 controlled by the controller may be provided for controlling the temperature of the edge exclusion shield during vapor deposition.

According to some embodiments described herein, the edge exclusion shield 130 includes an edge exclusion portion 131 for masking edge areas of the substrate not to be coated. In particular, a front portion of the edge exclusion shield 130 that is arranged close to the coating drum 30 may be configured as an edge exclusion mask that masks edge areas of the substrate that are to be kept free of coating material. In particular, one or two substrate edges 11 in the lateral direction L may be kept free of coating material due to the edge exclusion portions 131 of the edge exclusion shield 130 that act as an edge exclusion mask. For being able to act as an edge exclusion mask, the edge exclusion portion 131 may be arranged at a close distance from the substrate during vapor deposition, specifically at a distance of 2 mm or less or 1.5 mm or less, particularly about 1 mm or less (e.g., 1 mm+/−20%). A gap between the edge exclusion portion 131 and the flexible substrate of 2 mm or more during deposition may already lead to a considerable vapor propagation into the gap from distantly arranged nozzles, preventing an edge exclusion and providing sloping layer edges and coated substrate edges.

According to some embodiments described herein, a distance D between the edge exclusion portion 131 and the coating drum 30 is typically 2 mm or less, particularly 1 mm or less during vapor deposition. Hence, the edge exclusion portion 131 can act as an edge exclusion mask, masking the substrate edges and providing sharp and well-defined coating layer edges. For example, a coating layer thickness may drop from 100% to 1% or less within a range of 3 mm or less in the lateral direction L at a lateral coating layer edge.

Since the edge exclusion shield 130 is provided, the second coating 13 can be accurately deposited on the flexible substrate 10 at a predetermined position in the lateral direction L, and side edges of the second coating 13 can be very sharp and clearly defined. Further, since the lateral position of the flexible substrate on the coating drum is adjusted based on a measured lateral positioning of the first coating 12, the second coating 13 can be deposited accurately relative to the first coating 12, e.g. in alignment with the first coating on an opposite substrate side. Hence, a substrate can be manufactured that carries accurately aligned layer stacks on opposite substrate sides as may be suitable for the manufacture of a thin film battery. Further, since the second coating can be deposited accurately relative to the first coating due to the adjustment of the substrate position and due to the edge exclusion shield, the material utilization can be improved and it can be ensured that the second coating corresponds in width and position to the first coating.

In some embodiments, which can be combined with other embodiments described herein, the edge exclusion shield 130 is configured to mask two opposing edge areas of the flexible substrate. For example, as it is schematically depicted in FIG. 4, edge exclusion portions 131 of the edge exclusion shield 130 protrude toward a first edge area of the substrate in the lateral direction L and toward a second opposite edge area of the substrate in the lateral direction L, masking the edge areas near the substrate edges 11 and ensuring well-defined coating layer edges.

In some embodiments, which can be combined with other embodiments described herein, the at least one vapor source 120 may be configured to evaporate a metal, particularly a metal having an evaporation temperature of 500° C. or more, particularly 600° C. or more. In some implementations, the at least one vapor source 120 may be configured to deposit a lithium layer on the substrate. The at least one vapor source 120 may include a crucible 160 configured to be heated to a temperature of 600° C. or more, particularly 800° C. or more, and a distributor 161 configured to guide the vapor from the crucible 160 to the plurality of nozzles 121, wherein an inner volume of the distributor can be heated to a temperature of 600° C. or more, particularly 800° C. or more.

The vapor deposition apparatus may further include a heating arrangement 140 for actively or passively heating the edge exclusion shield 130 to an operation temperature, particularly to a temperature of 500° C. or more and 600° C. or less. Specifically, the operation temperature of the edge exclusion shield may be slightly above the vapor condensation temperature, e.g. 10° C. or more and 50° C. or less above the vapor condensation temperature, in order to avoid an excessive heat load toward the substrate.

Two, three or more vapor sources may be arranged next to each other along the circumferential direction of the coating drum, e.g., for depositing several material layers on the substrate or for depositing one thick material layer of the same material on the substrate. In one embodiment, two, three or more metal evaporation sources, particularly lithium sources, are arranged adjacent to each other in the circumferential direction of one rotatable drum (see FIG. 1), such that a thick metal layer can be deposited on the substrate, while the substrate moves on the curved drum surface 111 of one rotating drum.

Figure 5:
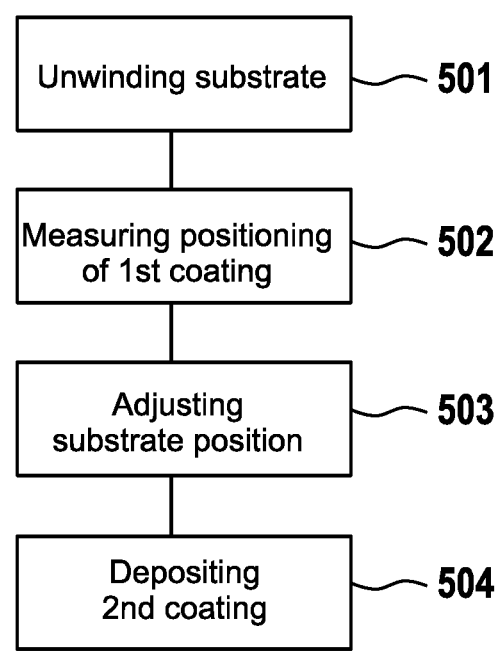
FIG. 5 shows a flowchart illustrating a method of coating a flexible substrate according to embodiments described herein.

FIG. 5 is a diagram for illustrating a method of coating a flexible substrate in a roll-to-roll deposition system according to embodiments described herein.

In box 501, the flexible substrate having a first coating on a first main side is unwound from an unwinding roll.

In box 502, a lateral positioning of the first coating is measured while the flexible substrate is guided to a coating drum. Specifically, a position of a side edge of the first coating may be determined. In some embodiments, the lateral positioning of the first coating is scanned continuously or at short time intervals by a respective sensor.

In box 503, a lateral position of the flexible substrate on the coating drum is adjusted depending on the measured lateral positioning of the first coating. The lateral position of the flexible substrate may be adjusted by axially moving the unwinding roll, e.g. via a linear actuator. The lateral position may be adjusted such that the first coating that is already provided on the substrate is aligned with a coating window defined by at least one vapor source. Accordingly, the second coating that is deposited by the at least one vapor source is deposited in alignment with the first coating.

In box 504, the second coating is deposited on the flexible substrate by the at least one vapor source, particularly on the second main side of the flexible substrate. The second coating can be deposited in alignment with the first coating.

The deposition in box 504 may include directing evaporated material to the second main side of the flexible substrate past an edge exclusion shield that extends from the at least one vapor source toward the coating drum. The edge exclusion shield may define a coating window on the curved drum surface of the coating drum where the evaporated material may impinge on the web substrate in the lateral direction L. The edge exclusion shield may mask areas of the substrate not to be coated, particularly side areas of the substrate not to be coated. An edge exclusion portion of the edge exclusion shield may extend in a circumferential direction of the coating drum and follow a curvature of the coating drum at a close distance to the curved drum surface.

In some embodiments, the vapor source is a metal source, particularly a lithium source, and the vapor is a metal vapor, particularly a lithium vapor. An operation temperature of the edge exclusion shield may be 500° C. or more and 600° C. or less, particularly between 500° C. and 550° C. If the vapor source is a lithium source, an evaporation temperature inside the vapor source may be 600° C. or more and 850° C. or less.

The substrate may be a flexible foil, particularly a flexible metal foil, more particularly a copper foil or a copper-carrying foil. The substrate may have a thickness of 50 μm or less, particularly 20 μm or less, e.g. about 8 μm. Specifically, the substrate may be a thin copper foil having a thickness in a sub 20-μm range.

Due to the control of the substrate position based on a current position of the first coating and due to the edge exclusion shield, the second coating can be continuously deposited in accurate alignment with the first coating, i.e. side edges of the first and second coatings may be at corresponding positions in the lateral direction, and the side edges of the second coating may be sharp and well-defined. Substrates that bear well-aligned coatings having sharp edges on both substrate sides can be manufactured, which is particularly beneficial in the manufacture of thin film batteries.

Embodiments described herein particularly relate to the following:

Embodiment 1: A method of coating a flexible substrate in a roll-to-roll deposition system, including: unwinding the flexible substrate from an unwinding roll, the flexible substrate having a first coating on a first main side; measuring a lateral positioning of the first coating while guiding the flexible substrate to a coating drum; adjusting a lateral position of the flexible substrate on the coating drum depending on the measured lateral positioning of the first coating; and depositing a second coating on the flexible substrate.

Embodiment 2: The method of embodiment 1, wherein the second coating is deposited on a second main side of the flexible substrate opposite the first main side.

Embodiment 3: The method of embodiment 1 or 2, wherein the lateral position of the flexible substrate on the coating drum is adjusted by axially moving the unwinding roll depending on the lateral positioning of the first coating.

Embodiment 4: The method of any of embodiments 1 to 3, wherein the measuring of the lateral positioning of the first coating includes determining a position of a side edge of the first coating.

Embodiment 5: The method of any of embodiments 1 to 4, wherein the lateral position of the flexible substrate is adjusted such that the second coating is deposited on a second main side of the flexible substrate in alignment with the first coating on the first main side.

Embodiment 6: The method of any of embodiments 1 to 5, wherein the lateral position of the flexible substrate is adjusted such that side edges of the second coating are aligned with side edges of the first coating, particularly with a deviation of 0.5 mm or less, more particularly 0.1 mm or less.

Embodiment 7: The method of any of embodiments 1 to 6, wherein the lateral position of the flexible substrate is adjusted using a feedback loop with the lateral positioning of the first coating as an input parameter.

Embodiment 8: The method of any of embodiments 1 to 7, wherein depositing the second coating includes directing evaporated material toward a second main side of the flexible substrate with a plurality of nozzles of at least one vapor source while the flexible substrate is moved past the at least one vapor source on a curved drum surface of the coating drum.

Embodiment 9: The method of any of embodiments 1 to 8, wherein depositing the second coating includes directing evaporated material toward the flexible substrate through a coating window defined by an edge exclusion shield that masks lateral edge areas of the flexible substrate not to be coated.

Embodiment 10: The method of embodiment 9, wherein the edge exclusion shield has a temperature of 500° C. or more during the deposition of the second coating.

Embodiment 11: The method of any of embodiments 1 to 10, wherein at least one of the first coating and the second coating is a lithium coating or includes a lithium-containing material.

Embodiment 12: The method of any of embodiments 1 to 11, wherein the flexible substrate includes a metal foil, particularly a copper foil.

Embodiment 13: The method of any of embodiments 1 to 12, wherein at least one of the first coating and the second coating constitutes an anode or forms a part of an anode for manufacturing a lithium battery.

Embodiment 14: A vapor deposition apparatus for coating a flexible substrate, including: an unwinding roll for unwinding the flexible substrate; at least one vapor source configured to deposit an evaporated material on the flexible substrate; a coating drum arranged downstream of the unwinding roll and configured to guide the flexible substrate past the at least one vapor source; a sensor configured to measure a lateral positioning of a first coating on a first main side of the flexible substrate; an actuator configured to adjust a lateral position of the flexible substrate on the coating drum; and a controller configured to control the actuator depending on the lateral positioning of the first coating.

Embodiment 15: The vapor deposition apparatus of embodiment 14, wherein the actuator includes a mechanism for axially moving the unwinding roll.

Embodiment 16: The vapor deposition apparatus of any of embodiments 14 to 15, wherein the at least one vapor source includes a plurality of nozzles to direct the evaporated material onto a second main side of the flexible substrate supported on the coating drum.

Embodiment 17: The vapor deposition apparatus of any of embodiments 14 to 16, further including an edge exclusion shield extending from the at least one vapor source toward the coating drum and at least partially surrounding a vapor propagation volume.

Embodiment 18: The vapor deposition apparatus of embodiment 17, wherein the edge exclusion shield includes an edge exclusion portion to mask edge areas of the flexible substrate not to be coated, the edge exclusion shield extending along the coating drum in a circumferential direction and following a curvature thereof.

Embodiment 19: The vapor deposition apparatus of embodiment 17 or 18, wherein the edge exclusion shield is heatable to an operation temperature above a condensation temperature of the evaporated material.

Embodiment 20: A method of manufacturing an anode of a lithium battery, including: guiding a flexible substrate in the vapor deposition apparatus, particularly in a vapor deposition apparatus as described herein; adjusting a lateral position of the flexible substrate depending on a lateral positioning of a first coating provided on a first main side of the flexible substrate; and directing evaporated material to a second main side of the flexible substrate past an edge exclusion shield to form a second coating on the flexible substrate such that the second coating is laterally aligned with the first coating.

While the foregoing is directed to embodiments, other and further embodiments may be devised without departing from the basic scope, and the scope is determined by the claims that follow.

The invention claimed is:

1. A method of coating a flexible substrate in a roll-to-roll deposition system, comprising:
   unwinding the flexible substrate from an unwinding roll, the flexible substrate having a first coating on a first main side;

measuring a lateral positioning of the first coating while guiding the flexible substrate to a coating drum;

adjusting a lateral position of the flexible substrate on the coating drum depending on the measured lateral positioning of the first coating; and depositing a second coating on a second main side of the flexible substrate opposite the first main side, wherein the lateral position of the flexible substrate is adjusted depending on the measured lateral positioning of the first coating such that the second coating is deposited on the second main side of the flexible substrate in alignment with the first coating on the first main side.

2. The method of claim 1, wherein the lateral position of the flexible substrate on the coating drum is adjusted by axially moving the unwinding roll depending on the lateral positioning of the first coating.

3. The method of claim 1, wherein the measuring of the lateral positioning of the first coating comprises scanning a position of a side edge of the first coating.

4. The method of claim 1, wherein the lateral position of the flexible substrate is adjusted such that side edges of the second coating are aligned with side edges of the first coating with a deviation of 0.5 mm or less.

5. The method of claim 1, wherein the lateral position of the flexible substrate is adjusted using a feedback loop with the lateral positioning of the first coating as an input parameter.

6. The method of claim 1, wherein depositing the second coating comprises directing evaporated material toward a second main side of the flexible substrate with a plurality of nozzles of at least one vapor source while the flexible substrate is moved past the at least one vapor source on a curved drum surface of the coating drum.

7. The method of claim 1, wherein depositing the second coating comprises directing evaporated material toward the flexible substrate past an edge exclusion shield that masks lateral edge areas of the flexible substrate not to be coated.

8. The method of claim 7, wherein the edge exclusion shield has a temperature of 500° C. or more.

9. The method of claim 1, wherein at least one of the first coating and the second coating is a lithium coating or comprises a lithium-containing material.

10. The method of claim 1, wherein the flexible substrate comprises a metal foil.

11. The method of claim 1, wherein at least one of the first coating and the second coating constitutes an anode or forms a part of an anode for manufacturing a lithium battery.

* * * * *